United States Patent
Zhong et al.

(10) Patent No.: US 6,555,283 B1
(45) Date of Patent: Apr. 29, 2003

(54) IMAGEABLE ELEMENT AND WATERLESS PRINTING PLATE

(75) Inventors: Xing-Fu Zhong, Wallington, NJ (US); Jianbing Huang, Trumbull, CT (US); S. Peter Pappas, Juno Beach, FL (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/589,334

(22) Filed: Jun. 7, 2000

(51) Int. Cl.⁷ .............................................. G03F 7/021
(52) U.S. Cl. ................. 430/166; 430/272.1; 430/281.1; 430/303; 430/394
(58) Field of Search ............................. 430/166, 272.1, 430/281.1, 303, 394

(56) References Cited

U.S. PATENT DOCUMENTS

| | | | |
|---|---|---|---|
| 3,511,178 A | 5/1970 | Curtin ........................ 101/450 |
| 3,677,178 A | 7/1972 | Gipe ........................... 101/450 |
| 3,847,614 A | 11/1974 | Mattor ........................... 96/75 |
| 3,885,964 A | 5/1975 | Nacci ......................... 96/35.1 |
| 3,894,873 A | 7/1975 | Kobayashi et al. ............ 96/33 |
| 3,933,495 A | 1/1976 | Kondo ert al. ................. 96/33 |
| 4,050,942 A | 9/1977 | Nacci .......................... 96/115 |
| 4,154,614 A | 5/1979 | Tsunoda et al. ............... 96/75 |
| 4,184,006 A | 1/1980 | Hockemeyer et al. ...... 428/447 |
| 4,198,242 A | 4/1980 | Pazos ......................... 430/286 |
| 4,198,342 A | 4/1980 | Pazos ......................... 430/286 |
| 4,342,820 A | 8/1982 | Kinashi et al. ............... 430/11 |
| 4,358,522 A | 11/1982 | Fujita et al. ................ 430/166 |
| 4,408,532 A | 10/1983 | Incremona ................... 101/456 |
| 4,631,245 A | 12/1986 | Pawlowski .................. 430/175 |
| 4,687,727 A | 8/1987 | Toyama et al. .............. 430/175 |
| 4,775,607 A | 10/1988 | Schlosser .................... 430/162 |
| 4,826,752 A | 5/1989 | Yoshida et al. ............. 430/155 |
| 4,842,990 A | 6/1989 | Herrmann et al. .......... 430/272 |
| 4,877,711 A | 10/1989 | Aoai et al. ................... 430/176 |
| 5,112,743 A | 5/1992 | Kamiya et al. ............. 430/175 |
| 5,232,813 A | 8/1993 | Okuno et al. ............... 430/156 |
| 5,339,737 A | 8/1994 | Lewis et al. ................. 101/454 |
| 5,353,705 A | 10/1994 | Lewis et al. ................. 101/453 |
| 5,379,698 A | 1/1995 | Nowak et al. .............. 101/454 |
| 5,503,074 A | 4/1996 | Hirano et al. ................ 101/456 |
| 5,695,905 A | 12/1997 | Savariar-Hauck et al. .. 430/162 |
| 5,700,619 A | 12/1997 | Baumann et al. ........... 430/175 |
| 5,773,187 A | 6/1998 | Gries et al. .................. 430/162 |
| 5,846,685 A | 12/1998 | Pappas et al. ............... 430/156 |
| 5,858,626 A | 1/1999 | Sheriff et al. ................ 430/326 |
| 5,919,600 A * | 7/1999 | Huang et al. ............. 430/272.1 |
| 5,925,491 A | 7/1999 | Baumann et al. ........... 430/175 |
| 5,955,238 A | 9/1999 | Yokoya et al. .............. 430/166 |
| 6,022,668 A * | 2/2000 | Burberry et al. ............ 430/303 |
| 6,187,511 B1 * | 2/2001 | Bennett et al. .............. 430/303 |
| 6,284,433 B1 * | 9/2001 | Ichikawa et al. ........... 430/303 |

FOREIGN PATENT DOCUMENTS

| | | |
|---|---|---|
| DE | 19644515 | 6/1998 |
| EP | 208145 | 1/1987 |
| EP | 738930 | 10/1996 |
| EP | 763780 | 3/1997 |
| WO | WO 9707430 | 2/1997 |
| WO | WO9831544 | 7/1998 |
| WO | WO9914048 | 3/1999 |

* cited by examiner

*Primary Examiner*—John S. Chu
(74) *Attorney, Agent, or Firm*—Faegre & Benson, LLP

(57) ABSTRACT

This invention relates to an imageable element that can be imaged and developed to produce a printing plate. The imageable element comprises a substrate and a radiation-sensitive imageable composition applied to the substrate. The imageable composition comprises (a) a first layer having (i) a photosensitive composition which undergoes a decrease in solubility in developer upon absorption of actinic radiation and (ii) an inhibitor, and (b) a second layer comprising an ink-repellent polymeric material. In one embodiment, the inhibitor is activated by heat or radiation of longer wavelength than actinic radiation. Upon activation, the inhibitor retards the solubility decrease of the photosensitive composition upon absorption of actinic radiation. In another embodiment, the inhibitor initially retards the solubility decrease of the photosensitive composition upon absorption of actinic radiation. However, the inhibitor is deactivated by heat or radiation of longer wavelength than actinic radiation, and upon deactivation the inhibitor no longer retards the solubility decrease of the photosensitive composition.

21 Claims, No Drawings

IMAGEABLE ELEMENT AND WATERLESS PRINTING PLATE

BACKGROUND OF THE INVENTION

1. Field of the Invention

This invention relates to an imageable element that can be employed to make a waterless lithographic printing plate. More particularly, this invention relates to an imageable element having a substrate and a radiation sensitive imageable composition applied thereon. The radiation sensitive imageable composition comprises a first layer having a photosensitive composition which undergoes a decrease in solubility in a developer upon absorption of actinic radiation by the first layer, and an inhibitor which may be activated to retard the decrease in solubility, or deactivated to avoid retarding the decrease in solubility.

2. Background Information

Waterless printing plates have existed since 1970 and have the advantage of not requiring fountain solution for offset printing. Most waterless printing plates involve an ink repellent layer such as silicone overlying a light absorbing imageable layer. Imaging is typically achieved by exposing the imageable layer to an ultraviolet radiation source then selectively removing the ink repellent coating.

For positive-working waterless plates, the imageable layer is a light absorbing layer typically containing a negative-working diazo resin, as described for example in U.S. Pat. Nos. 3,511,178; 3,677,178; and 4,775,607; or a light absorbing layer containing a photopolymerizable compound, as described for example in U.S. Pat. Nos. 3,894,873; 5,232,813, and 5,503,074. For negative-working waterless plates, imaging is achieved by solubilizing, via ultraviolet radiation, the imageable layer which typically contains diazonaphthoquinones, as described for example in U.S. Pat. Nos. 4,342,820 and 4,358,522; or imaging a layer that undergoes light-induced acid-catalyzed hydrolysis, as described for example in U.S. Pat. No. 4,842,990. Further, U.S. Pat. No. 3,933,495 describes a dual-tone waterless plate in which the solubility of the imageable layer is either enhanced or reduced by the developer in the developing step, depending upon which developer is used.

The majority of the plate manufacturing processes described above require a photographic film used as a mask for imaging the plate, which is expensive and tedious to make. However, recent advances in computer-to-plate (CTP) technologies have created the need to develop new waterless plates that can be imaged without the need of photographic film mask.

One method of adapting waterless plate-making technology to CTP applications is to generate a contact mask on a photosensitive waterless plate. The mask may be produced, for example, via a digital device such as an ink jet printer, electrographic printer, or any other apparatus employing a digitally controlled laser. The mask may also be produced by laser ablation, laser ablative transfer, laser induced color change techniques in a photochromic top layer or in a laser-induced solubilized or insolubilized opaque top layer. However, masked printing plates are also more costly and time-consuming to manufacture because they require an additional layer to form the mask.

For example, U.S. Pat. No. 5,339,737 describes physically transforming an infrared-absorbing layer by laser ablation using high doses of laser energy to remove the overlying silicone layer. However, this process is time consuming, and to circumvent the problem, U.S. Pat. No. 5,353,705 describes adding an ablatable, but non-infrared absorbing, layer, below the infrared absorbing layer. Another approach, described in U.S. Pat. No. 5,379,698, involves using a metallic or metal oxide thin film as the imageable layer.

In another example, European Pat. Publication 738 930 describes coating a polyester substrate with a layer comprising a component A which absorbs light in the infrared to visible region and thereby bleaches a second component B, which absorbs in the ultraviolet to visible region. This layer is used as a mask for a second image-forming photosensitive layer, so that imagewise IR exposure of component A, followed overall UV exposure of component B, followed by development, results in the image.

To avoid use of a mask layer, U.S. Pat. No. 5,955,238 describes a digital, negative-working, waterless plate precursor comprising a laser light-sensitive layer on a support which is over-coated with an ink repellent surface. The laser-sensitive layer contains an acid generator, an acid labile polymer, and a photothermal converter. The plate precursor is overall exposed to UV radiation, which generates acid, followed by imagewise IR laser exposure, which selectively solubilizes the acid labile polymer by a thermally induced, acid-catalyzed reaction. Aqueous development selectively removes the thermally exposed portions.

In another example, WIPO Publication WO 97/07430 describes a waterless plate precursor prepared by coating on a support a layer comprising a mixture of an ink-repellent component and photo-reactive component, which is imagewise exposed to heat or light to harden the imagewise-exposed areas.

A positive-working waterless plate that is imaged by imagewise exposure to actinic radiation is described in U.S. Pat. No. 4,775,607, and comprises a specific class of diazo resin condensates over-coated with a cross-linked silicone elastomer. The photosensitive layer is not suitable for digital imaging by exposure to long wavelength visible or IR radiation.

Thus, there is a need for an imageable element that may be used to prepare a waterless CTP printing plate which avoids the costly and time-consuming use of a mask layer. Further, there is a need for an imageable element for a waterless CTP printing plate which has dual tone, so that it may be digitally imaged by, for example, imagewise exposure to infrared laser, or analog imaged by, for example, imagewise exposure to actinic radiation. There is also a need for an imageable element that may be used to prepare printing plates having negative-working and positive-working embodiments. It is an object of this invention to provide such an imageable element and waterless printing plate. The imageable element and printing plate of this invention overcome the disadvantage of requiring a mask layer, and may be employed in negative-working and positive-working embodiments.

SUMMARY OF THE INVENTION

The limitations of current technology described above are overcome by this invention, which relates to the control of chemical reactions which affect the solubility in a developer of a photosensitive composition. Embodiments of this invention may comprise any photosensitive material that undergoes such a chemical reaction, and which can be affected by an intervening molecule such as inhibitors of the chemical reaction, which may affect the chemical reaction either directly or indirectly.

In one embodiment of this invention, an imageable element comprises: (A) a substrate; and (B) a radiation sensitive imageable composition applied on the substrate. The radiation sensitive imageable composition comprises: (a) a first layer, comprising (i) a photosensitive composition which undergoes a decrease in solubility in a developer upon absorption of actinic radiation by the first layer, and (ii) an inhibitor which is activated by heat or radiation of longer wavelength than the actinic radiation to retard the decrease in solubility of the photosensitive composition of the first layer upon absorption of actinic radiation, and (b) a second layer contiguous to the first layer comprising an ink repellent polymeric material which is transparent to both the actinic radiation and the longer wavelength radiation.

In this embodiment, the photosensitive composition of the first layer preferably comprises a condensate of an aryldiazonium salt or a mixture of aryldiazonium salts with a condensable compound. The inhibitor is preferably a dye or pigment which absorbs infrared radiation and is transparent to the actinic radiation, such as a cyanine dye. The ink repellent polymeric material of the second layer preferably comprises a crosslinked polydiorganosiloxane. This embodiment may be used to prepare a digital negative-working waterless printing plate by imagewise exposure to thermal or infrared radiation, or an analog positive-working waterless printing plate by imagewise exposure to actinic radiation.

In another embodiment of this invention, an imageable element comprises: (A) a substrate; and (B) a radiation sensitive imageable composition applied on the substrate. The radiation sensitive imageable composition comprises: (a) a first layer, comprising (i) a photosensitive composition which undergoes a decrease in solubility in a developer upon absorption of actinic radiation by the first layer, and (ii) an inhibitor which retards the decrease in solubility of the photosensitive composition of the first layer upon absorption of actinic radiation, in which the inhibitor is deactivated by heat or radiation of longer wavelength than the actinic radiation, in which the inhibitor upon deactivation does not retard the decrease in solubility of the photosensitive composition of the first layer upon absorption of actinic radiation, and (b) a second layer contiguous to the first layer comprising an ink repellent polymeric material which is transparent to both the actinic radiation and the longer wavelength radiation.

In this embodiment, the photosensitive composition of the first layer preferably comprises at least one photopolymerizable ethylenically unsaturated group, and preferably further comprises a non-infrared absorbing photoinitiator or photosensitizer. The inhibitor preferably comprises a nitroso dimer in equilibrium with a nitroso monomer, in which the nitroso monomer retards polymerization of the free radical polymerizable compound of the first layer. The first layer may further comprise a compound which absorbs infrared radiation. The ink repellent polymeric material of the second layer preferably comprises crosslinked polydiorganosiloxane. This embodiment may be used to prepare a digital positive-working waterless printing plate by imagewise exposure to thermal or infrared radiation.

In further embodiments, this invention is directed to a method of forming an image on a substrate comprising: providing a substrate, applying on the substrate a first layer and a second layer of a radiation sensitive imageable composition, thereby forming an imageable element, exposing the imageable element to infrared light imagewise, exposing the imageable element to actinic radiation, and developing the imageable element.

For a better understanding of the present invention and its objects, reference is made to the following description to be considered in light of the complete application, and the scope of this invention as pointed out in the appended claims.

DETAILED DESCRIPTION OF THE INVENTION

This invention is directed to an imageable element and method of making an imageable element, in which a radiation sensitive imageable composition comprises a first layer on a substrate. The first layer comprises a photosensitive composition which undergoes a decrease in solubility in a developer upon absorption of actinic radiation by the first layer. The ability to make a printing plate from the imageable element stems from the ability to control the change of solubility of the photosensitive first layer in a developer. The solubility of the photosensitive first layer is controlled by an inhibitor which may be activated to retard any decrease of solubility of the photosensitive first layer in a developer, or may be deactivated to permit a decrease in solubility of the photosensitive composition of the first layer upon absorption of actinic radiation. Activation or deactivation may be performed by exposing the inhibitor to heat or radiation of a different wavelength than the actinic radiation.

In one embodiment this invention is an imageable element comprising a first layer and a second layer applied on a substrate. The first layer comprises a photosensitive material and absorbs actinic radiation in the ultraviolet (UV) or visible spectral range, or combination thereof, which renders the layer less soluble in a developer liquid. The first layer further comprises an inhibitor which may be activated by heat or radiation of longer wavelength than the actinic radiation to retard the decrease in solubility of the photosensitive composition of the first layer upon absorption of actinic radiation. In this embodiment, the inhibitor may absorb energy to be activated, and upon activation retards the decrease in solubility of the photosensitive composition. The inhibitor remains substantially transparent to the actinic radiation in this embodiment.

This embodiment provides an imageable element that may be used to prepare a digital negative-working waterless printing plate by imagewise exposure to thermal or infrared radiation. In this exposure, the inhibitor is imagewise activated to retard the decrease in solubility in a developer of the photosensitive composition of the first layer in the image area. Following overall exposure to actinic radiation, subsequent development removes the second layer and at least part of the first layer in the imagewise exposed areas to produce a negative-working waterless printing plate.

By "negative-working" as used herein it is meant that the regions imagewise exposed to thermal or infrared radiation become the ink-receptive regions.

This embodiment also provides an imageable element that may be used to prepare an analog positive-working waterless printing plate by imagewise exposure to actinic radiation. In this exposure, the inhibitor is not activated and does not retard the decrease in solubility in a developer of the photosensitive composition of the first layer in the image area. Subsequent development removes the second layer and the first layer in the non-imagewise exposed areas to produce a positive-working waterless printing plate.

Polymeric compounds useful for the photosensitive material in the first layer may be diazonium polycondensation products such as the reaction product of a reactive diazonium salt derivative with any type of monomer or resin that has a suitable reactive condensable group. For example, such monomers or resins can have reactive condensable aldehyde groups. Preferably, formaldehyde and bis-methoxymethyl diphenyether are used as the condensable reactant. Illustrative examples of such diazonium compounds and derivatives which may be used in this invention are described in U.S. Pat. No. 4,631,245, which is incorporated herein by reference. A particularly preferred compound is the polymeric condensate of 4-phenylamino-2-methoxyphenyl diazonium salt with 4,4'-bismethoxymethyl diphenylether, and isomers thereof.

Reactive diazonium salt derivatives useful for the photosensitive material in the first layer of this invention include derivatives of N-aryl and N-alkyl aminoaryl diazonium salts. Further illustrative examples of polymeric compounds for the photosensitive material in the first layer are photo-hardening condensates of p-phenylaminobenzene diazonium and formaldehyde.

In preferred embodiments, the photosensitive material in the first layer may comprise a diazonium salt of the following formula:

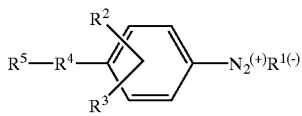

wherein $R^1$ is an anion, $R^2$ and $R^3$ represent optional substitution, $R^4$ is —$NR^6$— or —S—, and $R^5$ is a group which after exposure of the radiation sensitive imageable composition renders the residue of the diazonium salt oleophilic and fount insoluble. When $R^4$ is —$NR^6$—, $R^6$ is preferably hydrogen.

Preferably, $R^1$ is a sulphonate. When present, $R^2$ and $R^3$ are preferably selected from alkoxy, halogen, alkyl, or amine. The presence of a substituent group $R^2$ or $R^3$ helps to stabilize the diazonium compound. Preferably, $R^5$ is a group of the formula:

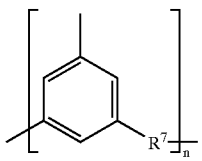

where $R^7$ is the residue of a condensing agent, and n is 1 to 100. For example, $R^7$ may be —$CH_2$— or:

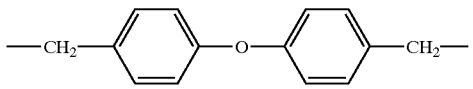

Thus, the group $R^5$ comprises a condensable group to convert the diazonium compound to a diazonium resin to prevent the exposed diazonium salt from washing off during processing.

The photosensitive material in the first layer is preferably a polymeric condensate of a diazonium salt or mixture of diazonium salts with formaldehyde, 4,4'-bis-methoxymethyl diphenylether and mixtures and derivatives thereof, such as described in U.S. Pat. No. 4,631,245.

Further illustrative examples of diazonium salts useful in the present invention are as follows:

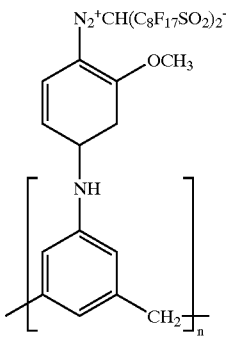

diazonium A

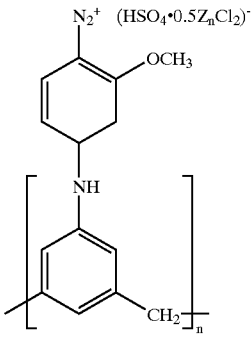

diazonium B

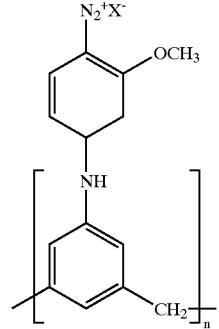

diazonium C where n is 1 to 11, and $X^-$ is a counteranion such as $SO_3R^-$, $BF_4^-$, $PF_6^-$, and the like, where R is an alkyl, aryl or aralkyl residue.

Illustrative examples of commercially available materials suitable for the photosensitive first layer of this invention are described in U.S. Pat. No. 4,687,727, which is incorporated herein by reference. A preferred compound is a condensate of 3-methoxydiphenylamine-4-diazonium sulfate and 4,4'-bismethoxymethyl diphenylether, preferably precipitated as the mesitylene sulfunate, available as NEGA 107 (Panchim).

The diazonium polycondensation products used in this invention may be obtained by a condensation reaction of diazo monomers with aldehydes and precipitation of the reaction product with a certain anion prepared by condensing a diazo monomer such as 4-diazo-diphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-N,N-dimethylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, p-diazodimethylaniline, 1-diazo-2,5,-dibutoxy-4-morpholinobenzene, 1-diazo-2,5-diethoxy-4- morpholinobenzene, 1-diazo-2,5-dimethoxy-4-p-tolymercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propoxy)-4-diazodiphenylamine or 3-(isopropoxy)-4-diazodiphenylamine with a condensing agent such as formaldehyde, acetaldehyde, propionaldehyde, butyric aldehyde, isobutyic aldehyde, benzaldehyde or aldehydes containing one or more carboxylic groups as described in U.S. Pat. No. 5,112,743 (incorporated herein by reference), preferably in a molar ratio of 1:1 to 1:0.5, more preferably 1:1 to 1:08, by a conventional process, followed by precipitation with a suitable anion.

Diazonium polycondensation products soluble in organic solvents are for instance obtained by selecting tetrafluoroboric acid, hexafluorophosphoric acid, hexafluoroantmonic acid, hexafluoroarsenic acid, triisopropylnapthalenesulfonic acid, 4,4'-biphenyldisulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoyl-benzene-sulfonic acid, 4-toluenesulfonic acid, and the like as anion source. Among these, 2,4,6-trimethylbenzene sulfonic acid and 2-methoxy-4-hydroxy-5-benzoylbenzene-sulfonic acid are particularly preferred.

Furthermore, mixed condensation products can be used which, apart from the diazonium salt units, comprise other non-photosensitive units, which are derived from condensable compounds, in particular from aromatic amines, phenols, phenol ethers, aromatic thioethers, aromatic hydrocarbons, aromatic heterocycles or organic acid amides.

Other illustrative examples of diazonium polycondensation products are adducts of diazonium resins with sulfonated polymers. Such diazonium adducts can be used without a binder, in place of the diazonium salt condensates which may be used with a binder. Diazonium adducts consisting of diazonium resins with sulfonated acrylic polymers are described in U.S. Pat. No. 5,846,685; corresponding adducts consisting of diazonium resins with sulfonated polyesters are disclosed in U.S. Pat. Nos. 4,408,532 and 5,846,685, both of which are incorporated herein by reference.

The diazonium polycondensation product or products are preferably present in the radiation-sensitive compositions in an amount from about 1 to about 98 wt. % based on the total weight of the composition, more preferably from about 5 to 80 wt. % and most preferably from about 20 to about 60 wt. %.

The photosensitive first layer may additionally comprise polymeric compounds that act as binders. Preferable binders promote adhesion to the substrate upon exposure to actinic radiation. Illustrative examples of binder polymeric compounds suitable for the first layer include copolymers of vinyl acetate such as vinyl acetate/crotonate/vinyl neodecanoate copolymers, copolymers of styrene and maleic anhydride, carboxyl-functionalized polyvinyl acetals, acetal-functionalized polyvinyl alcohols, and carboxy-functional acrylics.

As the polymeric binder, any binder known to be useful in conventional printing plates based on diazonium polycondensation products can be used. Such binders are usually alkali-soluble resins. From the standpoint of developability acryl type resins are preferred, while from the standpoint of durability polyurethane resins and an acetal-modified poly (vinyl alcohol) resin are preferred. Suitable binder materials are for instance disclosed in U.S. Pat. No. 5,700,619, U.S. Pat. No. 3,847,614, U.S. Pat. No. 4,154,614, DE 19 64 4515, U.S. Pat. No. 5,695,905, U.S. Pat. No. 4,877,711, and EP 208145, which are hereby incorporated by reference in their entireties. Especially preferred are polyvinylacetal binders comprising the following units A, B and C:

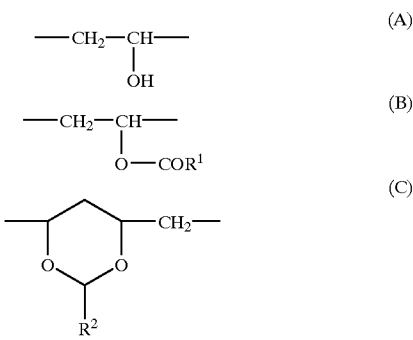

wherein $R^1$ is H or $C_1$–$C_4$ alkyl, CH=CHCOOH or

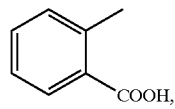

$R^2$ is H, $C_1$–$C_4$ alkyl, aryl,

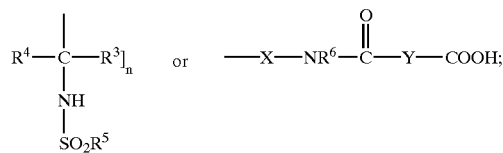

wherein $R^3$ and $R^4$ are independently selected from hydrogen and methyl, n is an integer from 1 to 3 and $R^5$ is alkyl, aralkyl, aryl, alkoxyaryl or alkanoyl amide aryl wherein the alkyl moieties have 1 to 8 carbon atoms and the aryl moieties have 6 or 10 carbon atoms $R^6$ is hydrogen or an aliphatic, aromatic or araliphatic group having 1 to 10 carbon atoms, Y is —$CR^7R^8$—$CR^9R^{10}$—, —$CR^7$=$CR^8$—, or of the following structures:

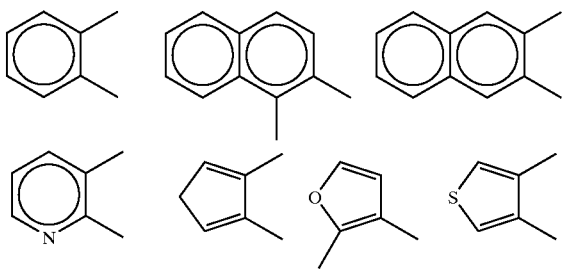

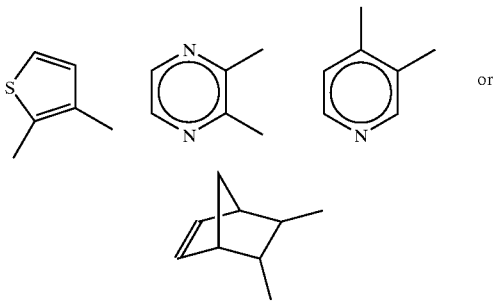

wherein $R^7$, $R^8$, $R^9$, $R^{10}$ each are independently hydrogen or $C_1-C_4$ alkyl, and X is $-CH_2-$, $-CH(CH_3)-$ or $-CH_2CH_2CH_2-$.

Units (B) and (C) may be present several times in a polymer molecule with independently selected different groups $R^1$ and $R^2$.

If a binder is present, the weight ratio of binder to diazonium salt condensate is preferably from about 50:1 to about 0.1:1, more preferably from about 20:1 to about 0.2:1, and most preferrably from about 5:1 to about 0.3:1.

In this embodiment, the first layer also comprises an inhibitor which absorbs and is activated by thermal energy, longer wavelength visible radiation or, preferably, infrared radiation, and when activated retards the decrease in solubility of the photosensitive composition of the first layer upon absorption of actinic radiation. Preferably, the inhibitor remains substantially transparent to the actinic radiation in this embodiment. Without intending to be bound by any one theory, it is believed that the inhibitor, upon being activated, retards the ability of the photosensitive first layer to react by absorbing actinic radiation. Thus, imagewise exposure of the first layer to energy or radiation which is absorbed by the inhibitor causes imagewise reduction of the ability of the first layer to react to actinic radiation.

Without intending to be bound by any one theory, it is believed that the inhibitor may be activated to directly interact with the photosensitive material and retard the reaction of the photosensitive material upon absorption of actinic radiation. In other embodiments, the inhibitor may function indirectly, for example, as a photothermal conversion agent, by converting absorbed radiation into heat, which subsequently retards the reaction of the photosensitive material.

Preferably, in this embodiment the inhibitor is a pigment or dye which absorbs in the IR or near IR spectral region. Many such products are known to those skilled in the art. Preferably, the inhibitor comprises a dye or pigment selected from the group consisting of arylamminium, polymethine, quinolium, triarylmethane, triarylamine, thiazolium, indolium, oxazolium, polyaniline, polypyrrole, polythiophene, thiolene metal complexes, squarilium, croconate, cyanine, phthalocyanine, merocyanine, chalcogenopyryloarylidine, bis(chalcogenopyrylo) polymethine, oxyindolizine, quinoid, indolizine, pyrylium, thiazine, azulenium, xanthene, carbon black, dark inorganic pigments, black pigments, yellow pigments, orange pigments, brown pigments, red pigments, violet pigments, blue pigments, green pigments, fluorescent pigments, azo pigments bound to a polymer, anthraquinone pigments bound to a polymer, quinacridone pigments bound to a polymer, and mixtures thereof. Further illustrative examples of infrared-absorbing compounds suitable for the inhibitor of this invention are given in U.S. Pat. No. 5,858,626, incorporated herein by reference. Most preferably, the inhibitor in this embodiment is 2-[2-[2-chloro-3-[(1,3-dihydro-1,1,3-trimethyl-2H-benz[e]indol-2-ylidene) ethylidene]-1-cyclohexen-1-yl]ethenyl]-1,1,3-trimethyl-1H-Benz[e]indolium salt with 4-methylbenzenesulfonic acid.

Illustrative IR-absorbing compounds useful in this embodiment may have a low oxidation potential, less than about 0.8 eV (based on standard hydrogen electrode). Especially preferred are IR dyes of the formula (I):

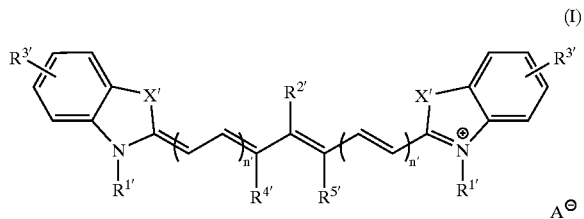

wherein:

each X' independently represents S, O, NR' or C(alkyl)$_2$;

each $R^{1'}$ independently is an alkyl group, an alkylsulfonate or an alkylammonium group;

$R^{2'}$ represents a halogen atom, SR', SO$_2$R', OR' or NR'$_2$;

each $R^{3'}$ independently represents a hydrogen atom, an alkyl group, COOR', OR', SR', NR'$_2$; a halogen atom or a substituted or unsubstituted benzofused ring;

A$^-$ represents an anion;

$R^{4'}$ and $R^{5'}$ are each a hydrogen atom, or are joined together to form a carbocyclic five- or six-membered ring;

each R' independently represents hydrogen, an alkyl or aryl group; and each n' independently is 0, 1, 2 or 3.

In those embodiments in the present invention in which $R^{4'}$ and $R^{5'}$ are joined together to form a carbocyclic five membered ring, the IR dye may be represented by the formula (II):

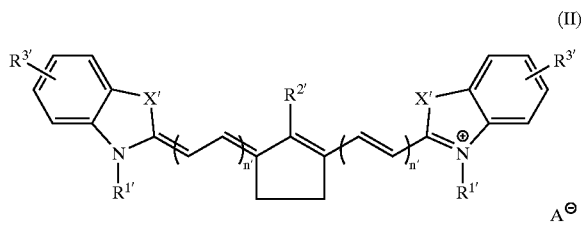

where the remaining variables are as previously defined.

In these embodiments where $R^{4'}$ and $R^{5'}$ are joined together to form a carbocyclic six-membered ring, the IR dye may be represented by the formula (III):

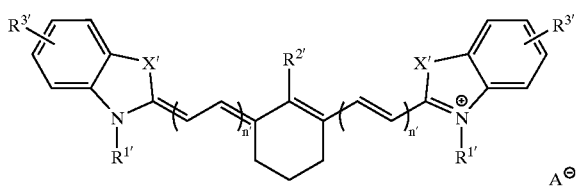

(III)

where the remaining variables are as previously defined.

These dyes may absorb in the range of 750 to 1100 nm; dyes of the above formula (I) which absorb in the range of 810 to 860 nm are especially preferred. In a preferred embodiment:

X' is preferably a C(alkyl)$_2$ group;

R$^{1'}$ is preferably an alkyl group with 1 to 4 carbon atoms;

R$^{2'}$ is preferably SR';

R$^{3'}$ is preferably a hydrogen atom;

R' is preferably an alkyl or aryl group; especially preferred is a phenyl group; and A$^-$ is preferably a chloride ion or a tosylate ion.

Especially preferred are the following IR dyes:

2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indoliumchloride;

2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indoliumchloride;

2-[2-[2-thiophenyl-3-[2-(1,3-dihydro-1,3,3-trimethyl-2H-indol-2-ylidene)-ethylidene]-1-cyclopenten-1-yl]-ethenyl]-1,3,3-trimethyl-3H-indoliumtosylate;

2-[2-[2-chloro-3-[2-ethyl-(3H-benzthiazole-2-ylidene)-ethylidene]-1-cyclohexen-1-yl]-ethenyl]-3-ethyl-benzthiazolium-tosylate; and 2-[2-[2-chloro-3-[2-(1,3-dihydro-1,3,3-trimethyl-2H-indol-2-ylidene)-ethylidene]1-cyclohexen-1-yl]-ethenyl]-1,3,3-trimethyl-3H-indolium-tosylate.

The inhibitor may be present in the first layer of the radiation sensitive imageable composition of this embodiment preferably in an amount from or about 0.1 to about 30 weight percent of the layer, more preferably from or about 1 to or about 20 weight percent, and most preferably from or about 3 to or about 15 weight percent.

In another embodiment, this invention is directed to an imageable element comprising a substrate and a radiation sensitive imageable composition applied on the substrate which comprises (a) a first layer, comprising (i) a photosensitive composition which undergoes a decrease in solubility in a developer upon absorption of actinic radiation by the first layer, and (ii) an inhibitor which retards the decrease in solubility of the photosensitive composition of the first layer upon absorption of actinic radiation, in which the inhibitor is deactivated by heat or radiation of longer wavelength than the actinic radiation, so that the inhibitor upon deactivation does not retard the decrease in solubility of the photosensitive composition of the first layer upon absorption of actinic radiation, and (b) a second layer contiguous to the first layer comprising an ink repellent polymeric material which is transparent to both the actinic radiation and the longer wavelength radiation.

In this embodiment, the inhibitor has the inherent property of retarding the decrease in solubility of the photosensitive composition of the first layer. In other words, the inhibitor is inherently active to retard the decrease in solubility of the photosensitive composition. By absorbing energy, the inhibitor in this embodiment is deactivated, and upon deactivation can no longer retard the decrease in solubility of the photosensitive composition of the first layer upon absorption of actinic radiation. The inhibitor in this embodiment may have a chemical structure different from the inhibitor of the previous embodiment because it operates in a different way. In this embodiment, the inhibitor has the property of continuously retarding the ability of the photosensitive composition of the first layer to undergo a decrease in solubility in a developer. In this embodiment, it is only when the inhibitor is deactivated by absorption of energy that the photosensitive composition of the first layer may be induced to undergo a decrease in solubility in a developer because the inhibitor is no longer functioning to inhibit the decrease.

This embodiment provides an imageable element that may be used to prepare a digital positive-working waterless printing plate by imagewise exposure to thermal or infrared radiation. In this exposure, the inhibitor is imagewise deactivated and the photosensitive composition of the first layer may undergo a decrease in solubility in a developer in the imagewise exposed areas during subsequent overall exposure to actinic radiation. Subsequent development removes the second layer and the first layer in the non-imagewise exposed areas to produce a positive-working waterless printing plate.

In this embodiment, the photosensitive composition of the first layer preferably comprises at least one photopolymerizable ethylenically unsaturated group. The photopolymerizable ethylenically unsaturated composition may be, for example, a free radical polymerizable material. Illustrative photopolymerizable compositions suitable for this embodiment are described in U.S. Pat. No. 3,885,964, U.S. Pat. No. 4,050,942, and U.S. Pat. No. 4,198,242, all of which are incorporated by reference.

In this embodiment, the photosensitive composition of the first layer may further comprise a non-infrared absorbing photoinitiator or photosensitizer. A large number of such compounds are known to those of skill in the art, including benzophenone and substituted benzophenones. Illustrative examples of photoinitiators suitable for this embodiment are described in U.S. Pat. No. 3,885,964, U.S. Pat. No. 4,050,942, and U.S. Pat. No. 4,198,242, all of which are incorporated herein by reference.

The inhibitor of this embodiment preferably comprises a nitroso dimer in equilibrium with a nitroso monomer, in which the nitroso monomer retards polymerization of the free radical polymerizable compound of the first layer. Under exposure of the first layer to actinic radiation the nitroso monomer is consumed by absorbing energy to retard chemical change in the photosensitive composition of the first layer. However, the concentration of the unconsumed monomer may be replenished by dissociation of the nitroso dimer to provide further nitroso monomer to act as an inhibitor to the decrease in solubility in a developer of the photosensitive composition of the first layer. Illustrative examples of nitroso compounds suitable for this embodiment are described in U.S. Pat. No. 4,050,942, and U.S. Pat. No. 4,198,242. Further illustrative examples of inhibitors suitable for this embodiment include nitrosoaromatic compounds such as those described in U.S. Pat. No. 3,885,964.

The first layer may further comprise an infrared-absorbing dye or pigment. By absorbing infrared radiation the dye or pigment may deactivate the inhibitor used in this embodiment, for example, by converting infrared radiation into heat. Infrared-absorbing compounds suitable for the dye or pigment of this embodiment include those described above in a reference to the earlier embodiment of this invention and are well known to those skilled in the art.

The first layer may additionally comprise polymeric compounds that act as binders and promote adhesion to the substrate. Illustrative examples of binder polymeric compounds suitable for the first layer are described in U.S. Pat. No. 4,050,942 and U.S. Pat. No. 4,198,242.

In preferred embodiments of this invention, the second polymeric layer is transparent to the radiation that transforms the first layer, and the second polymeric layer comprises an ink-repellent polymeric material. The ink-repellent polymeric material may be crosslinked to enhance solvent resistance, providing greater resistance to press chemicals for longer press life, and enabling printing with UV/EB inks.

An illustrative example of the ink-repellent polymeric material for use in preferred embodiments of this invention is a crosslinked polydiorganosiloxane comprising the repeating units —$SiR^1R^2$—O—, in which $R^1$ and $R^2$ are independently selected from a monovalent alkyl, aryl or alkenyl group, or a combination thereof. $R^1$ and $R^2$ may contain functional substituent groups such as hydroxyl, halogen, amino, alkoxy, aryloxy, (meth)acryloxy, and thiol. Preferably, $R^1$ and $R^2$ are methyl, which should be in the majority when a mixture of $R^1$ and $R^2$ groups is used. The silicone layer may optionally contain pigments and fillers such as silica, calcium carbonate, and titanium oxide. Adhesion promoters may also be added to the coating to improve silicone layer formation.

Polydiorganosiloxane networks may be formed, for example, by known crosslinking reactions such as the condensation of a silanol and acyloxy or alkoxy silanes, the addition of hydrosilane to alkenyl groups, and the photo-initiated polymerization of (meth)acrylate or epoxy groups; however, preferred are the condensation and addition methods.

For the condensation crosslinking method, a silanol terminated diorganosiloxane polymer, for example, may be reacted with polyacyloxy or polyalkoxy silane crosslinkers in the presence of a suitable catalyst. This reaction may be accelerated both by heat and moisture. For a better pot life during manufacturing, a silicone network may be formed via the self condensation between polydiorganosiloxane with trialkoxysilyl groups on both ends, as is described in European Pat. Application EP 0 763 780, incorporated herein by reference. Catalysts suitable for this condensation are organic carboxylic acid salts of tin, zinc and other multivalent metals that are well known in the art. Adhesion promoters may also be included in this type of silicone coating formulation. Preferred adhesion promoters are aminosilanes, such as represented by the general formula $R_mR'_nSi(OR'')_{4-m-n}$, where R is unsubstituted or monosubstituted amino-alkyl, R' and R" are each alkyl or aryl, m is 1 or 2, and n is 0 or 1, m+n being equal to 1 or 2. Specific examples of such aminosilanes are γ-aminopropyltriethoxy silane and γ-[N-(2-aminoethyl)-amino]propyl trimethoxy silane.

Polydiorganosiloxanes crosslinked via addition reaction between hydrosilane and alkenyl groups may be prepared, for example, from a vinyl functional polydiorganosiloxane and methyl hydrosiloxane homopolymer or copolymer in the presence of a suitable catalyst. The alkenyl groups in the siloxane polymer may be randomly distributed along the polymeric chain, or located at the chain ends. The addition catalysts may be selected from known ones; however, preferred are elemental platinum, platinum chloride, chloroplatinic acid and platinum coordinated with olefins. To improve pot-life, volatile inhibitors such as ketones, alcohols and alkynes may be used. Particularly preferred are alkynes such as those disclosed in U.S. Pat. No. 4,184,006, incorporated herein by reference. Specific examples of such alkynes are 2-methyl-3-butyne-2-ol, ethynylcyclohexanol, 2-butyne, 2-methyl-but-1-en-3-yne, and phenyl acetylene.

Organic solvents may be used to facilitate film formation of the silicone layer. Suitable solvents include aliphatic and aromatic hydrocarbons, ketones, and esters. Specific examples of useful solvents are hexane, heptane, toluene, xylene, 2-butanone, and amyl acetate. The amount of solvents used primarily depends upon molecular weights of silicone starting materials, coating thickness and the coating application technique. Coating methods for applying silicone coatings are known in the art. Preferred coating methods for use in this invention include whirl coating, wire-wound bar coating, direct gravure coating, gravure-offset coating, liquid curtain coating, slit-extrusion coating, meniscus coating and the like.

Substrates which may be used in preferred embodiments of this invention may be any sheet material conventionally used to prepare lithographic printing plates. Suitable substrates include metals such as aluminum sheets; paper; paper coated on one or both sides with an alpha-olefin polymer such as polyethylene; films such as cellulose acetate film, polyvinyl acetal film, polystyrene film, polypropylene film, polyester film such as polyethylene terephthalate film, polyamide film, polyimide film, nitrocellulose film, polycarbonate film, and polyvinylchloride film; composite films such as polyester, polypropylene or polystyrene film coated with polyethylene film; metalized paper or films; metal/paper laminates; and the like. Such substrates may contain an antihalation compound or sub coatings.

A preferred substrate is an aluminum sheet. The surface of the aluminum sheet may be treated by metal finishing techniques known in the art including brush roughening, electrochemical roughening, chemical roughening, anodizing, and silicate sealing and the like. If the surface is roughened, the average roughness (Ra) is preferably in the range from 0.1 to 0.8 micrometers, and more preferably in the range from 0.4 to 0.6 micrometers. The preferred thickness of the aluminum sheet is in the range from about 0.005 inch to about 0.020 inch.

The surfaces of plastic films may be treated using the surface treatment techniques known in the art to improve adhesion between the substrate and organic coatings.

In preferred embodiments of this invention, the radiation sensitive imageable composition may be applied to the substrate such that the dry weight of the photosensitive first layer is preferably about or greater than 0.1 to about or less than 6 g/m$^2$, more preferably about or greater than 0.2 to about or less than 4 g/m$^2$, most preferably about or greater than 0.4 to about or less than 2 g/m$^2$.

In preferred embodiments of this invention, the radiation sensitive imageable composition may be applied to the substrate such that the dry weight of the ink repellent second layer is preferably about or greater than 0.1 to about or less than 6 g/m$^2$, more preferably about or greater than 0.2 to about or less than 4 g/m$^2$, most preferably about or greater than 0.4 to about or less than 2 g/m$^2$.

The layers may be applied to the substrate by methods known to those of skill in the art including, but not limited to whirl coating, spin coating, knife coating, spray coating, laminating methods, and the like.

An imageable element prepared from this invention may also contain one or more ancillary layers to improve interlayer adhesion, to reduce halation effects, to improve printing surface characteristics, and the like. Optional layers that may be added to modify the invention include a protective layer laminated on top of the second layer, an adhesion promotion layer between the second layer and the first layer, and a primer layer between the first layer and the substrate.

An optional primer layer may be inserted between the first layer and the substrate of the radiation sensitive imageable composition to, for example, prevent heat loss, especially when the substrate is a metal sheet, to regulate ink receptivity, to serve as a dye acceptor, if the developed plate needs to be dyed for visual image contrast enhancement, or to act as an adhesion promoter. The primer layer may be a thermoplastic coating, provided the coating is not soluble in the solvents employed to make the infrared absorbing layer. Examples of thermoset coatings include polyester-melamine coatings, acrylic melamine coatings, epoxy coatings, and polyisocyanate coatings. An example of a thermoplastic coating is polyvinyl alcohol. When cured by ultraviolet radiation, the primer layer may be prepared from free radical polymerizable coatings, cationic crosslinkable coatings catalyzed by photo generated acid, and diazo resin with suitable binders.

An optional adhesion promotion layer may be inserted between the second layer and the first layer of the radiation sensitive imageable composition, preferably comprising aminosilanes, such as represented by the general formula $R_m R'_n Si(OR'')_{4-m-n}$, where R is unsubstituted or monosubstituted amino-alkyl, R' and R'' are each alkyl or aryl, m is 1 or 2, and n is 0 or 1, m+n being equal to 1 or 2. Specific examples of such aminosilanes are γ-aminopropyltriethoxy silane and γ-[N-(2-aminoethyl)-amino]propyl trimethoxy silane.

An optional protective layer may be laminated on top of the second layer to protect the surface of the second layer during storage and handling. Typically the protective layer is a thin polymeric film including polyesters such as polyethylene terephthalate, polyolefins such as polyethylene and polypropylene, and the like. The protective layer is designed to be easily removed without damaging the second layer surface either prior to or during processing.

Optional exposure indicators usable in the radiation sensitive imageable compositions are known to those skilled in the art, like exposure indicators from the series of triarylmethane dyes, such as Victoria blue BO, Victoria blue R, crystal violet, or diazo dyes such as 4-phenylazodiphenylamine, azobenzene, or 4-N,N-dimethylaminoazobenzene. Preferably, the exposure indicators are present in the radiation sensitive imageable composition in an amount of about 0.02 to 10 weight %, with about 0.5 to 6 weight % being more preferred, based on the weight of the first layer.

Optional dyes for increasing the image contrast are those which are easy to dissolve in the solvent or solvent mixture used for coating or which can be introduced as pigment in dispersed form. Suitable contrast dyes are, for example, rhodamine dyes, methyl violet, anthraquinone pigments and phthalocyanine dyes or pigments. Preferably, the dyes are present in the radiation sensitive imageable composition in an amount of about 1 to 15 weight %, preferably about 2 to 7 weight %, based on the weight of the first layer.

The radiation sensitive imageable composition according to this invention is applied to the substrate in the form of a solution prepared by dissolving the components. Illustrative examples of the solvent include cyclohexanone, cyclopentanone, 2-heptanone, γ-butyrolactone, methyl ethyl ketone, ethylene glycol monomethyl ether, ethylene glycol monoethyl ether, 2-methoxyethyl acetate, propylene glycol monomethyl ether, propylene glycol monomethyl ether acetate, methanol, acetone, tetrahydrofuran, methyl lactate and ethyl lactate. These solvents may be used singly or in admixture.

One or more surfactants may be added to the solvent. Specific examples of such surfactants include nonionic surfactants such as polyoxyethylene alkyl ethers, polyoxyethylene-polyoxypropylene block copolymers, fluorine surfactants, organosiloxane polymers and acrylic or methacrylic copolymers, which are known to those of skill in the art. The amount of the surfactant or surfactants to be incorporated is usually in the range of about 2 parts by weight or less, preferably about 1 part by weight or less, based on 100 parts by weight of solid content of the radiation sensitive imageable composition according to this invention.

Advantageously, no mask layer is used in preferred embodiments of this invention, whether digital or analog, and contrary to processes involving photographic film or additional photosensitive layers, only one development step is required.

The developer liquid may be any liquid or solution which can both penetrate the second layer and selectively dissolve or disperse the reaction products without substantially affecting the unexposed areas of the infrared absorbing layer. Preferred developer solutions are those that contain polypropylene glycol ethers. A more preferred developer solution is tripropylene glycol n-butyl ether. The developer liquid may be diluted with a non-developing liquid. As used herein, the term non-developing liquid is intended to mean any liquid which does not penetrate the second layer or does not selectively dissolve or disperse the exposed areas or both. Non-developing liquids include liquids such as polypropylene glycol and aliphatic hydrocarbon solvents. Specific aliphatic hydrocarbon solvents are heptane and ISOPAR solvents available from Exxon Chemical Company.

Typically the developer liquid is applied to the imaged waterless plate by rubbing or wiping the second layer with an applicator containing the developer liquid. In the development operation the developer liquid penetrates the second layer and dissolves or disperses the imaged areas of the infrared absorbing layer and the wiping action physically removes the solubilized areas along with overlying areas of the second layer. Alternatively, the imaged waterless plate may be brushed with the developer liquid or the developer liquid may be applied to the plate by spraying the second layer with sufficient force to remove the solubilized areas. In either instance, a developed printing plate is produced which has uncovered areas which are ink receptive and complimentary areas of the second layer, not exposed to infrared radiation, which are effectively ink repellent.

This invention relates to the control of chemical reactions which affect the solubility of the photosensitive composition of the first layer in a developer. Embodiments of this invention are not limited to the photosensitive materials described above, but include any photosensitive material that undergoes a chemical reaction which can be affected by an intervening molecule.

The following examples further describe and demonstrate embodiments within the scope of the present invention. The examples are given solely for the purpose of illustration and are not to be construed as limitations of the present invention. While there have been described illustrative embodiments of this invention, those skilled in the art will recognize that they may be changed or modified without departing from the spirit and scope of this invention, and it is intended to claim all such changes and modifications that fall within the true scope of the invention as set forth in the appended claims. All documents referenced herein are specifically incorporated by reference in their entirety.

EXAMPLE 1

A waterless printing plate was prepared by first dissolving 10.8 g of polyvinyl acetal resin, as described in Example 5 of U.S. Pat. No. 5,700,619, and 9.6 g of negative diazo resin, NEGA 107 (P.C.A.S., France), (a resin derived from polycondensation of 4-phenylamino-2-methoxyphenyl diazonium sulfate and 4,4'-bismethoxymethyl diphenylether, isolated as the mesitylene sulfonate salt) and 3.6 g of IR dye 2-[2-[2-chloro-3-[(1,3-dihydro-1,1,3-trimethyl-2H-benz[e]indol-2-ylidene)ethylidene]-1-cyclohexen-1-yl]ethenyl]-1,1,3-trimethyl-1H-Benz[e]indolium salt with 4-methylbenzenesulfonic acid, in 776 g of a solvent mixture of 30% 2-methoxyethanol, 45% methanol, and 25% methyl ethyl ketone. The solution was spin coated onto an electrolytically grained, lithographic substrate, hydrophilized with polyvinyl phosphonic acid, at 70 rpm for 3 minutes, to provide a first layer of about 1.0 g/m$^2$.

The first layer was over-coated with a silicone composition, as described in Table 1, which was dried and cured at 95° C. for 3 min and 130° C. for 1 min to provide a silicone layer of 1.5 g/m$^2$.

TABLE 1

| Silicone composition | |
| --- | --- |
| Component | weight % |
| poly(dimethylsiloxane-co-methylvinylsilane) (PS 255) | 3.77 |
| polydimethylsiloxane (SL6020) | 0.28 |
| diallyl maleate (SL6040, inhibitor) | 0.1 |
| platinum complex (PC075) | 0.1 |
| IsoPar E | 94 |

In a negative-working digital mode, the digital waterless printing plates were IR-laser imaged with an exposure range of 150–260 mJ/cm$^2$ (830 nm), using a Creo Trendsetter, followed by overall UV exposure of 200 mJ/cm$^2$. The plates were developed with methyl ethyl ketone, 2-butoxyethanol or 2-methyl-2,4-pentanediol, resulting in removal of the imagewise exposed areas of the first and second layers. These plates were used on a press to produce good quality images.

EXAMPLE 2

In a positive-working analog mode, plates as described in Example 1 were first imagewise exposed with UV at 200 mJ/cm$^2$, then developed as described in Example 1, resulting in removal of the unexposed areas of the first and second layers. The plates were run on press with waterless ink to provide more than 50,000 impressions of high quality.

EXAMPLE 3

A waterless printing plate was prepared by first dissolving 5.3 g of polyvinyl acetal resin, Z467, described in Example 3 below, 7.5 g of NEGA 107, and 2.1 g of IR dye 2-[2-[2-chloro-3-[(1,3-dihydro-1,1,3-trimethyl-2H-benz[e]indol-2-ylidene)ethylidene]-1-cyclohexen-1-yl]ethenyl]-1,1,3-trimethyl-1H-Benz[e]indolium salt with 4-methylbenzenesulfonic acid, in 484 g of the solvent mixture of Example 1. The solution was spin coated onto the substrate of Example 1, under the same conditions, to provide a first layer of about 1.0 g/m$^2$.

The first layer was over-coated with the silicone composition of Example 1 and cured accordingly to provide a silicone layer of 1.5 g/m$^2$.

The plates were laser imaged, as described in Example 1, over the range of 150–300 mJ/cm$^2$, followed by overall UV exposure at 140, 200, 220, 240, 260 mJ/cm$^2$. The plates were developed with tripropyleneglycol n-butyl ether in a Corning processor at 1.8 ft/min. The temperature of the soak section and that of the scrub section were 40° C. and 35° C., respectively. Good quality images were obtained throughout the 150–300 mJ/cm$^2$ range, when the overall UV exposure did not exceed 200 mJ/cm$^2$.

The synthesis of poly vinyl acetal Z467 was carried out as follows. 150 g of polyvinyl alcohol (MW=31,000–50,000; Aldrich Chemical) was dissolved in 2600 g of deionized water. The solution was cooled to 5° C. and 60 g of acetaldehyde, 100 g of butyraldehyde, and 90 g of 20% HCl were added. The reaction was allowed to proceed at 5° C. for 24 hours. The product was filtered and washed with deionized water until the filtrate became neutral. The product was air-dried first and then at 60° C. overnight.

EXAMPLE 4

An imageable element is prepared by applying onto the substrate of Example 1, a first layer comprising N-phenyl-N-methylacrylamide and nitrosocyclohexane dimer. The first layer is over-coated with the silicone composition of Example 1 and is cured accordingly to provide a silicone layer of 1.5 g/m$^2$.

It should be understood that various changes and modifications to the preferred embodiments described herein will be apparent to those skilled in the art. Such changes and modifications may be made without departing from the spirit and scope of the present invention and without diminishing its attendant advantages. It is therefore intended that such changes and modifications be covered by the appended claims.

We claim:

1. An imageable element comprising:
   (A) a substrate; and
   (B) a radiation sensitive imageable composition applied on the substrate comprising:
      (a) a first layer, comprising:
         (i) a photosensitive composition which undergoes a decrease in solubility in a developer upon absorption of actinic radiation by the first layer, and
         (ii) an inhibitor which is activated by heat or radiation of longer wavelength than the actinic radiation to retard the decrease in solubility of the photosensitive composition of the first layer upon absorption of actinic radiation, wherein the inhibitor is a cyanine dye and is present in an amount equal to or greater than 1% by weight of the first layer, and
      (b) a second layer contiguous to the first layer comprising an ink repellent polymeric material which is transparent to both the actinic radiation and the longer wavelength radiation.

2. An imageable element comprising:
   (A) a substrate; and
   (B) a radiation sensitive imageable composition applied on the substrate comprising:
      (a) a first layer, comprising:
         (i) a photosensitive composition which undergoes a decrease in solubility in a developer upon absorption of actinic radiation by the first layer, in which the photosensitive composition of the first layer comprises a condensate of an aryldiazonium salt or a mixture of aryldiazonium salts with a condensable compound, and (ii) an inhibitor which is activated by heat or radiation of longer wavelength than the actinic radiation to retard the decrease in solubility of the photosensitive composition of the first layer upon absorption of actinic radiation, wherein the inhibitor is present in an amount equal to or greater than 1% by weight of the first layer, and (b) a second layer contiguous to the first layer comprising an ink repellent polymeric material which is transparent to both the actinic radiation and the longer wavelength radiation.

3. The imageable element of claim 2, in which the condensable compound is selected from the group consisting of aldehydes, bis-methoxymethyl diphenyl ether, and mixtures thereof.

4. The imageable element of claim 1, in which the inhibitor absorbs infrared radiation.

5. The imageable element of claim 1, in which the inhibitor is transparent to the actinic radiation.

6. The imageable element of claim 1, in which the ink repellent polymeric material of the second layer comprises crosslinked polydiorganosiloxane.

7. An imageable element comprising:

(A) a substrate; and
(B) a radiation sensitive imageable composition applied on the substrate comprising:
  (a) a first layer, comprising:
    (i) a photosensitive composition which undergoes a decrease in solubility in a developer upon absorption of actinic radiation by the first layer;
    (ii) an inhibitor which retards the decrease in solubility of the photosensitive composition of the first layer upon absorption of actinic radiation, in which the inhibitor is deactivated by heat or radiation of longer wavelength than the actinic radiation, such that the inhibitor upon deactivation does not retard the decrease in solubility of the photosensitive composition of the first layer upon absorption of actinic radiation; and
  (b) a second layer contiguous to the first layer comprising an ink repellent polymeric material which is transparent to both the actinic radiation and the longer wavelength radiation.

8. The imageable element of claim 7, in which the photosensitive composition of the first layer comprises at least one photopolymerizable ethylenically unsaturated group.

9. The imageable element of claim 7, in which the photosensitive composition of the first layer further comprises a non-infrared absorbing photoinitiator or photosensitizer.

10. The imageable element of claim 7, in which the inhibitor comprises a nitroso dimer in equilibrium with a nitroso monomer, in which the nitroso monomer retards polymerization of the free radical polymerizable compound of the first layer.

11. The imageable element of claim 7, in which the first layer further comprises a compound which absorbs infrared radiation.

12. The imageable element of claim 7, in which the ink repellent polymeric material of the second layer comprises crosslinked polydiorganosiloxane.

13. The imageable element of claim 7, in which the first layer further comprises a dye or pigment selected from the group consisting of arylamminium, polymethine, quinolium, triarylmethane, triarylamine, thiazolium, indolium, oxazolium, polyaniline, polypyrrole, polythiophene, thiolene metal complexes, squarilium, croconate, cyanine, phthalocyanine, merocyanine, chalcogenopyryloarylidine, bis(chalcogenopyrylo)polymethine, oxyindolizine, quinoid, indolizine, pyrylium, thiazine, azulenium, xanthene, carbon black, dark inorganic pigments, black pigments, yellow pigments, orange pigments, brown pigments, red pigments, violet pigments, blue pigments, green pigments, fluorescent pigments, azo pigments bound to a polymer, anthraquinone pigments bound to a polymer, quinacridone pigments bound to a polymer, and mixtures thereof.

14. A method of forming an image on a substrate comprising:

(a) providing a substrate;
(b) applying on the substrate a first layer of a radiation sensitive imageable composition comprising:
  (i) a photosensitive composition which undergoes a decrease in solubility in a developer upon absorption of actinic radiation by the first layer; and
  (ii) an inhibitor which is activated by heat or radiation of longer wavelength than the actinic radiation to retard the decrease in solubility of the photosensitive composition of the first layer upon absorption of actinic radiation;
(c) applying on the first layer a second layer of a radiation sensitive imageable composition contiguous to the first layer comprising an ink repellent polymeric material which is transparent to both the actinic radiation and the longer wavelength radiation, thereby forming an imageable element;
(d) imagewise exposing the imageable element to heat or radiation of longer wavelength than actinic radiation;
(e) thereafter exposing the imageable element to actinic radiation; and
(f) developing the imageable element.

15. The method of claim 14, in which the photosensitive composition of the first layer comprises a condensate of an aryldiazonium salt or a mixture of aryldiazonium salts with a condensable compound.

16. A method of forming an image on a substrate comprising:

(a) providing a substrate;
(b) applying on the substrate a first layer of a radiation sensitive imageable composition comprising:
  (i) a photosensitive composition which undergoes a decrease in solubility in a developer upon absorption of actinic radiation by the first layer; and
  (ii) an inhibitor which retards the decrease in solubility of the photosensitive composition of the first layer upon absorption of actinic radiation, in which the inhibitor is deactivated by heat or radiation of longer wavelength than the actinic radiation, such that the inhibitor upon deactivation does not retard the decrease in solubility of the photosensitive composition of the first layer upon absorption of actinic radiation; and
(c) applying on the first layer a second layer of a radiation sensitive imageable composition contiguous to the first layer comprising an ink repellent polymeric material which is transparent to both the actinic radiation and the longer wavelength radiation, thereby forming an imageable element;
(d) imagewise exposing the imageable element to heat or radiation of longer wavelength than actinic radiation;

(e) thereafter exposing the imageable element to actinic radiation; and (f) developing the imageable element.

17. The method of claim 16, in which the photosensitive composition of the first layer comprises at least one photopolymerizable ethylenically unsaturated group.

18. The method of claim 16, in which the inhibitor comprises a nitroso dimer in equilibrium with a nitroso monomer, in which the nitroso monomer retards polymerization of the free radical polymerizable compound of the first layer.

19. The imageable element of claim 1, wherein the inhibitor is present in an amount equal to or greater than 2% by weight of the first layer.

20. The method of claim 14, wherein the imagewise exposure of the imageable element is performed using infrared radiation.

21. The method of claim 16, wherein the imagewise exposure of the imageable element is performed using infrared radiation.

* * * * *